(12) United States Patent
Liu et al.

(10) Patent No.: US 9,496,727 B2
(45) Date of Patent: Nov. 15, 2016

(54) CHARACTERIZING A RECHARGEABLE BATTERY THROUGH DISCONTINUOUS CHARGING

(71) Applicant: Atieva, Inc., Redwood City, CA (US)

(72) Inventors: Albert Liu, Redwood City, CA (US); Samuel Chang, Redwood City, CA (US); Monika Minarcin, Redwood City, CA (US)

(73) Assignee: Atieva, Inc., Menlo Park, CA (US)

(*) Notice: Subject to any disclaimer, the term of this patent is extended or adjusted under 35 U.S.C. 154(b) by 534 days.

(21) Appl. No.: 13/686,808

(22) Filed: Nov. 27, 2012

(65) Prior Publication Data
US 2014/0145684 A1    May 29, 2014

(51) Int. Cl.
| H02J 7/16 | (2006.01) |
| H02J 7/00 | (2006.01) |
| G01R 31/36 | (2006.01) |
| H01M 10/44 | (2006.01) |
(Continued)

(52) U.S. Cl.
CPC .......... *H02J 7/0022* (2013.01); *B60L 3/0046* (2013.01); *B60L 11/1816* (2013.01); *B60L 11/1824* (2013.01); *B60L 11/1846* (2013.01); *B60L 11/1857* (2013.01); *B60L 11/1861* (2013.01); *B60L 11/1864* (2013.01); *G01R 31/3662* (2013.01); *H01M 10/44* (2013.01); *H02J 7/0021* (2013.01); *B60L 2240/545* (2013.01); *B60L 2240/547* (2013.01); *B60L 2240/549* (2013.01); *B60L 2240/80* (2013.01); *B60L 2250/16* (2013.01); *G01R 31/3624* (2013.01); *Y02T 10/7005* (2013.01); *Y02T 10/7044* (2013.01); *Y02T 10/7055* (2013.01); *Y02T 10/7061* (2013.01); *Y02T 10/7072* (2013.01); *Y02T 90/121* (2013.01); *Y02T 90/128* (2013.01); *Y02T 90/14* (2013.01); *Y02T 90/163* (2013.01); *Y02T 90/169* (2013.01); *Y04S 30/14* (2013.01)

(58) Field of Classification Search
USPC .......... 320/139, 141, 145, 152; 324/426–434
See application file for complete search history.

(56) References Cited

U.S. PATENT DOCUMENTS

| 7,615,967 B2* | 11/2009 | Cho ................... G01R 31/3679 320/132 |
| 2006/0202857 A1* | 9/2006 | Kawahara .......... G01R 31/3624 340/870.02 |
| 2010/0213901 A1* | 8/2010 | Morimoto ............. B60L 3/0046 320/145 |

OTHER PUBLICATIONS

MPower Solutions Ltd Jan. 15, 2005 [date provided by <URL: https://archive.org/web/>], battery chargers and charging method. Retrieved from the Internet <URL:http://www.mpoweruk.com/chargers.htm>, 5 Pages.*

(Continued)

*Primary Examiner* — Drew A Dunn
*Assistant Examiner* — Zixuan Zhou
(74) *Attorney, Agent, or Firm* — Womble Carlyle Sandridge & Rice LLP

(57) ABSTRACT

A rechargeable battery pack is discontinuously charged in multiple discrete charging intervals. Reductions in battery pack voltage that occur during non-charging intervals, each transpiring between a respective pair of the discrete charging intervals, are measured. Multiple resistance values that characterize the internal resistance (DC resistance) of the battery pack are generated based on the reductions in battery pack voltage that occur during the non-charging intervals.

22 Claims, 4 Drawing Sheets

(51) Int. Cl.
  *B60L 3/00*   (2006.01)
  *B60L 11/18*  (2006.01)

(56) References Cited

OTHER PUBLICATIONS

MPower Solutions Ltd Jan. 15, 2005 [date provided by <URL: https://archive.org/web/>], battery chargers and charging method. Retrieved from the Intert <URL: http://www.mpoweruk.com/chargers.htm>, 5 Pages.*

MPower Solutions Ltd Jan. 15, 2005 [date provided by <URL: https://archive.org/web/>], battery chargers and charging method. Retrieved from the Internet <URL: http://www.mpoweruk.com/chargers.htm>, 5 Pages.*

* cited by examiner

DCR Determinations on Date A

405

|       | SOC 1 | SOC 2 | SOC 3 | SOC 4 |
|-------|-------|-------|-------|-------|
| Temp 1 | DCR 1-1-A | DCR 1-2-A | DCR 1-3-A | DCR 1-4-A |
| Temp 2 | DCR 2-1-A | DCR 2-2-A | DCR 2-3-A | DCR 2-4-A |
| Temp 3 | DCR 3-1-A | DCR 3-2-A | DCR 3-3-A | DCR 3-4-A |
| Temp 4 | DCR 4-1-A | DCR 4-2-A | DCR 4-3-A | DCR 4-4-A |

410

DCR Determinations on Date B

415

|       | SOC 1 | SOC 2 | SOC 3 | SOC 4 |
|-------|-------|-------|-------|-------|
| Temp 1 | DCR 1-1-B | DCR 1-2-B | DCR 1-3-B | DCR 1-4-B |
| Temp 2 | DCR 2-1-B | DCR 2-2-B | DCR 2-3-B | DCR 2-4-B |
| Temp 3 | DCR 3-1-B | DCR 3-2-B | DCR 3-3-B | DCR 3-4-B |
| Temp 4 | DCR 4-1-B | DCR 4-2-B | DCR 4-3-B | DCR 4-4-B |

420

DCR Determinations on Date C

425

|       | SOC 1 | SOC 2 | SOC 3 | SOC 4 |
|-------|-------|-------|-------|-------|
| Temp 1 | DCR 1-1-C | DCR 1-2-C | DCR 1-3-C | DCR 1-4-C |
| Temp 2 | DCR 2-1-C | DCR 2-2-C | DCR 2-3-C | DCR 2-4-C |
| Temp 3 | DCR 3-1-C | DCR 3-2-C | DCR 3-3-C | DCR 3-4-C |
| Temp 4 | DCR 4-1-C | DCR 4-2-C | DCR 4-3-C | DCR 4-4-C |

Fig. 4

CHARACTERIZING A RECHARGEABLE BATTERY THROUGH DISCONTINUOUS CHARGING

FIELD OF THE INVENTION

The present invention relates to rechargeable energy storage systems, including battery systems.

BACKGROUND

The state-of-heath (SOH) of a rechargeable battery is a metric relating to the battery's power and energy delivery capability, as well as the efficiency with which the battery is charged from dynamic and static charging sources, all characteristics which tend to decay over the battery's useful life. Accordingly, in the context of an electrically powered vehicle, accurate determination of the battery SOH tends to be critical in accurately predicting or determining driving range, acceleration, charging time, ability to recover energy from regenerative breaking, and, ultimately, end of useful life.

Despite the critical importance of obtaining accurate SOH metrics, conventional techniques rely on individual determinations of DC resistance (DCR) taken under varying conditions, which has the disadvantage of resulting in varying determinations of DCR for a battery with a particular SOH and consequently less accurate determinations of SOH.

BRIEF DESCRIPTION OF THE DRAWINGS

The present invention is illustrated by way of example, and not limitation, in the figures of the accompanying drawings and in which like reference numerals refer to similar elements and in which:

FIG. 4 shows exemplary tables for storing the change in DCR over time.

DETAILED DESCRIPTION

Figure 1A:
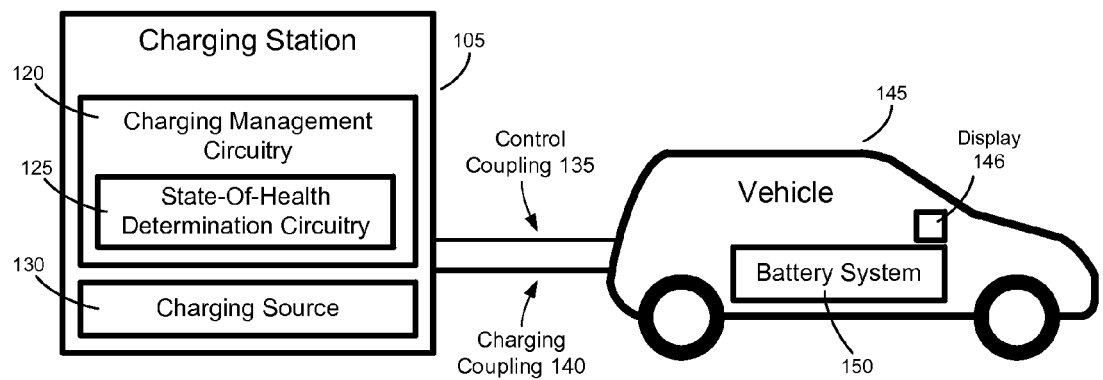
FIG. 1A illustrates one embodiment of a battery pack charging station capable of determining the change in DCR over time of a battery pack in an electric vehicle coupled to the charging station.

In various embodiments disclosed herein determinations of a rechargeable battery's DC resistance or "DCR" are obtained through discontinuous (interrupted) battery charging, with the DCR being leveraged in determining yet other operational characteristics of the rechargeable battery, including state-of-health (SOH). More specifically, state-of-health tends to be highly correlated to the DCR of a rechargeable battery, as the battery's DCR (or internal resistance) determines the capacity of the battery and the amount of power that can be delivered to a load. For example, in an electric vehicle, including any vehicle which contains an electrochemical energy storage system to provide power (wholly or in part) to the vehicle propulsion system, increased DCR may result in reduced propulsion power and thus reduced vehicle acceleration, as more of the total energy production is consumed by internal losses. Increased DCR reduces the vehicle driving range for the same reasons.

In one embodiment, the DCR of a battery pack (i.e., pack containing rechargeable batteries) is determined in a repeatable manner by periodically interrupting the battery pack charging process. During each interruption of the charging process, the reduction or "relaxation" of the battery pack voltage after the charging current temporarily stops flowing is measured and used the determine the DCR. As discussed below, other characteristics of the battery pack (e.g., temperature, state-of-charge, etc.) may be factored into the DCR determination and/or recorded to enable tabulation or other organization of the DCR determination. The relatively brief interruption intervals (i.e., periods when no current is flowing to the battery pack) add negligibly to the overall battery charging time, thus enabling an improved DCR determination (yielding a predictor/determinant of state-of-health and/or other battery characteristics), without significantly extending the charging process. This benefit is particularly significant in vehicles powered exclusively by a rechargeable battery pack (i.e., in contrast to a hybrid electric vehicle) as such electric-only vehicles that typically require frequent at-rest charging (e.g., daily), so that any significant extension of battery charging time cuts directly into vehicle availability. Additionally, by making DCR determination part of the regular charging process, alternative DCR determination techniques that impede normal (driving) operation of the vehicle are avoided.

Monitoring the change in DCR over time as the battery ages may indicate several conditions, including when the battery pack needs to be replaced or if maintenance of the battery pack is required. In one embodiment, described in greater detail below, the state-of-charge (SOC) of the battery pack is also determined at the same time the DCR is determined. As the determined DCR for a battery pack may vary with the SOC of the battery pack, the DCR can be adjusted to compensate for the variations in SOC to provide improved accuracy and consistency of the determination of how DCR changes over time, which allows for improved information regarding how the battery is "wearing" or "aging".

In another embodiment, the interrupted-charging DCR determination may be leveraged to achieve improved capacity, power delivery and life expectancy characteristics over the life of the battery pack. If the battery pack is used in a battery powered apparatus or vehicle (including passenger-conveying vehicles, powered at least in part by the battery pack, such as hybrid electric or electric vehicles), an improved estimation of the range or endurance of the apparatus or vehicle, and an improved estimate of when the battery pack will need to be replaced, may be presented to the operator of the apparatus or vehicle.

FIG. 1A illustrates one embodiment of a charging station capable of determining the change in DCR over time of a battery system 150 in a vehicle 145 coupled to the charging station 105. The embodiment illustrated in FIG. 1A shows an electric vehicle coupled to the charging station. Other embodiments may include other types of battery powered apparatus or vehicle, including hybrid-electric or entirely-electric vehicles, trains, busses or aircraft, as well as any other battery-powered systems or products. In the embodiment shown, the charging station 105 comprises charging management circuitry 120 and a charging source 130. The charging management circuitry, which includes state-of-health determination circuitry 125, controls the charging process, for example, by determining the electrical output of the charging source throughout the charging processes and adjusting the voltage and/or the current output of the charging source. As explained below, state-of-health determination circuitry 125 may periodically cause the charging management circuitry to interrupt the charging process to allow voltage deltas (i.e., differences between two or more voltage measurements) to be measured, measurements used in turn to determine the battery DCR, SOC and/or SOH.

Still referring to FIG. 1A, charging station 105 is coupled to the battery system 150 within electric vehicle 145 via a control coupling 135 and a charging coupling 140. The control coupling permits the bidirectional flow of both control information and data between the electric vehicle and the charging station including, without limitation, charging current measurements, battery pack voltages, battery pack temperatures, battery pack DCR information, electric vehicle range estimates, and electric vehicle battery system cooling controls. The charging coupling 140 comprises two electrical conductors (positive and negative) that carry the electrical current that is used to charge the battery system in the electric vehicle. Other embodiments may utilize only one coupling, or alternatively, more than two couplings for control and charging functions. Further embodiments may have control couplings that only permit a unidirectional (one-way) flow of information and/or have charging couplings that permit electrical power to flow from the battery system in the electric vehicle to the charging station. Also, as shown, a display 146 within the vehicle may be used to present information to the vehicle operator (or service technician) regarding the performance and status of the battery system.

Figure 1B:
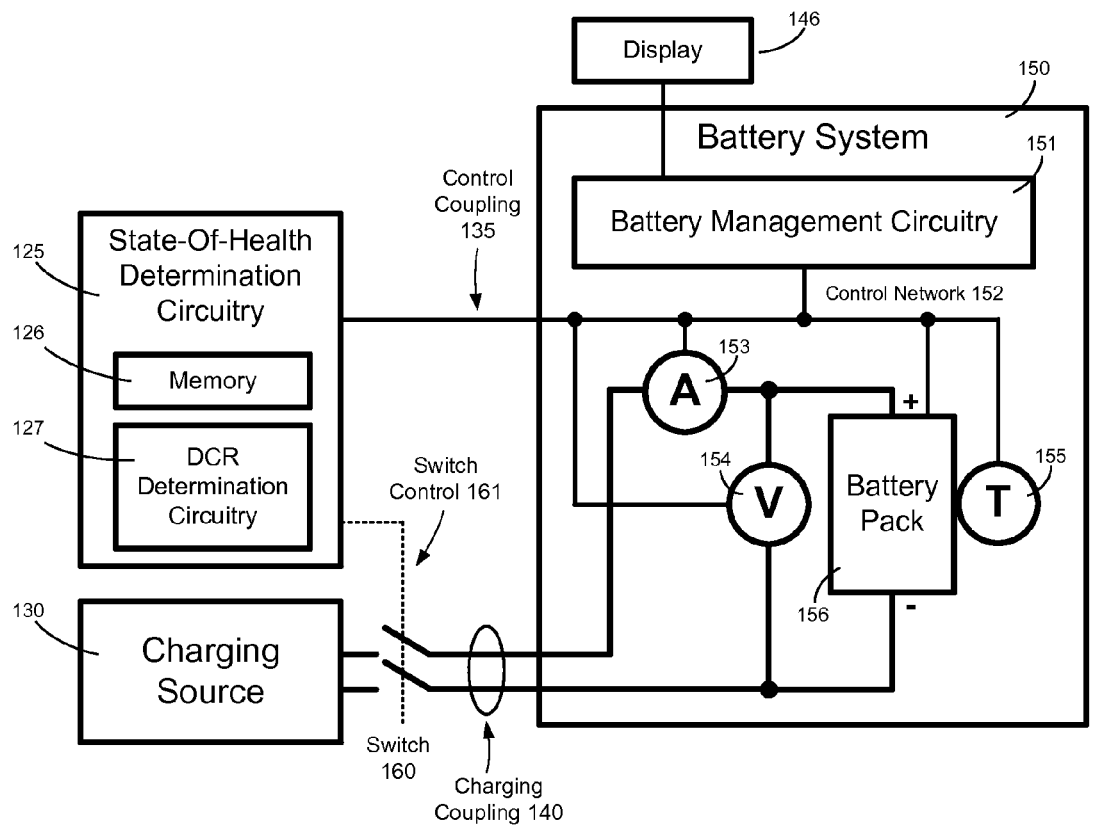
FIG. 1B illustrates one embodiment of circuitry capable of determining the change in DCR over time of a battery pack.

FIG. 1B illustrates the state-of-health determination circuitry 125, charging source 130 and battery system 150 of FIG. 1A in greater detail. The state-of-health determination circuitry may be used to implement the interrupted-charging, DCR determination and state-of-health operations discussed below in reference to FIG. 2 and comprises memory 126 (to store information generated from the charging process, including an historical record of the battery pack temperature, SOC and DCR determinations from multiple charges at different times and software code and data associated with executing the sequence of operations in FIGS. 2A and 2B) and DCR determination circuitry 127, which may be implemented at least in part by a programmed processor. The state-of-health determination circuitry is electrically coupled to the battery system 150 via the control coupling 135 and the charging source switch 160 via the switch control 161. The charging source 130 provides the energy necessary to charge the battery pack 156 in the battery system 150 and is electrically coupled to the battery system via the charging coupling 140. The battery system 150 comprises battery management circuitry 151 (to monitor and control the charging of the battery pack to prevent events including, but not limited to, excessive battery pack temperatures and overcharging of the battery pack), a battery pack 156, a current measuring device 153, a voltage measuring device 154, and a temperature measuring device 155. The temperature measuring device may be thermally coupled to the battery pack to provide more accurate information regarding the temperature of the battery pack. The control network 152 electrically couples components of the battery system to provide control and data transmission functions. The control network is electrically coupled to the control coupling 135.

Figure 2:
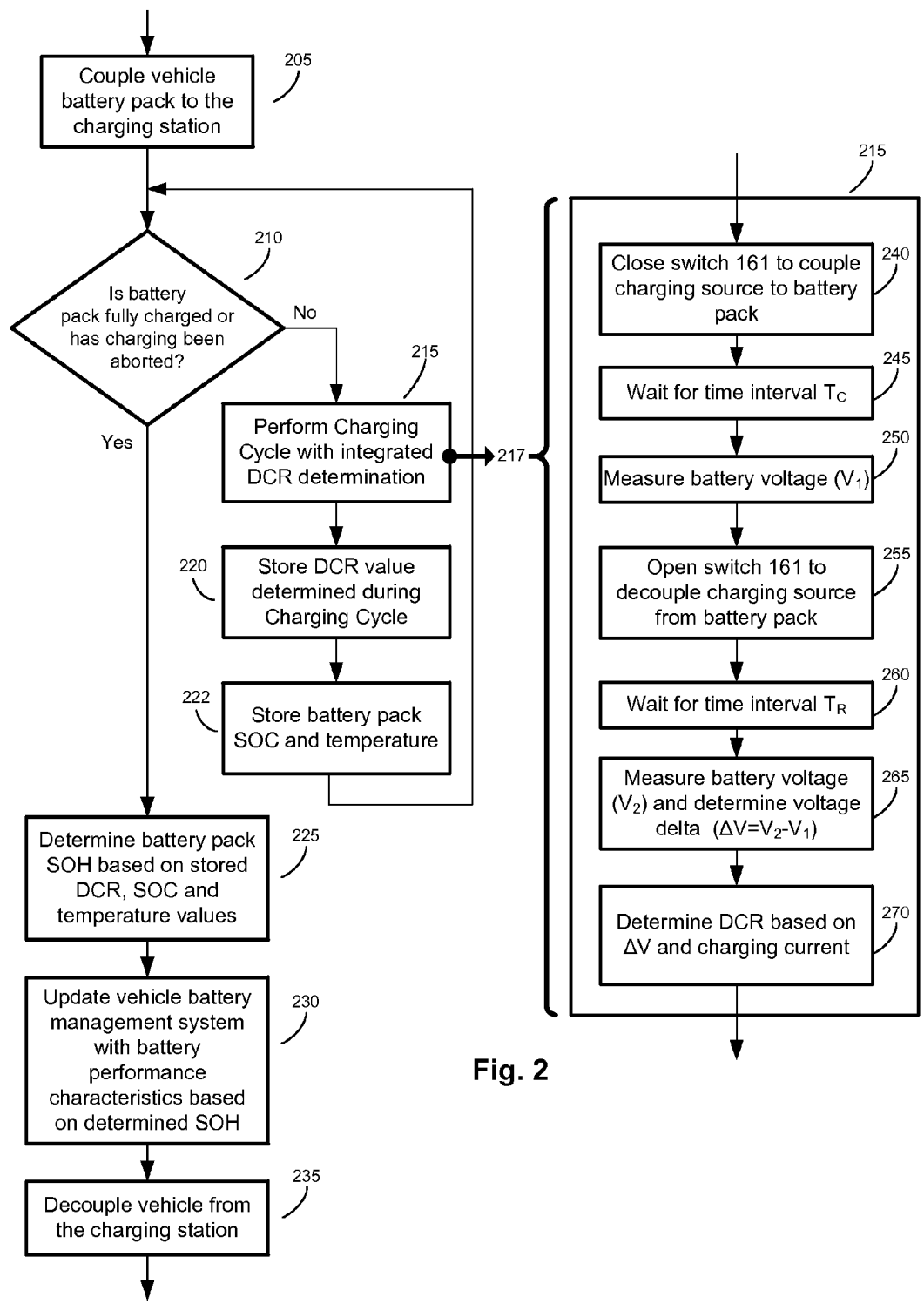
FIG. 2 shows an exemplary sequence of operations for determining the change in DCR over time of a battery pack and for performing a charging cycle during the determination of the change in DCR over time of a battery pack.

FIG. 2 shows an exemplary sequence of operations for determining the change in DCR over time of a battery pack. The sequence begins with the coupling of the battery pack to the charging station at 205, for example, by plugging electrical cables containing the control coupling and charging coupling into a socket in the host vehicle (other interconnect methods/structures may be used). At 210, after the vehicle battery pack is coupled to the charging station, the charging management circuitry (e.g., element 120 of FIG. 1A) determines if the battery pack is fully charged or if the charging process has been aborted (for example, the operator has decoupled the battery pack from the charging station). If the battery pack is not fully charged and the charging process has not been interrupted (i.e. negative determination at 210), a charging cycle is executed at 215, an operation that yields a DCR determination as shown in expanded view 217 and discussed in greater detail below. At 220, after a charging cycle is completed, the DCR value determined during the charging cycle is stored in memory 126. The state-of-charge (SOC) may also be determined during or after the charging cycle and stored in memory (e.g., together with the battery pack temperature) as shown at 222. In one embodiment, for example, the charging management circuitry and/or battery management circuitry may determine the battery pack SOC by accumulating the total amount of charge delivered to the battery (sometimes referred to as "coulomb counting") during the charging cycle at 215. Alternative or supplementary SOC determination techniques may be employed in other embodiments.

Still referring to FIG. 2, following the operations at 215, 220 and 222, control returns to decision block 210, thus enabling the charging cycle at 215 (and associated storage operations at 220, 222) to be repeated until the battery pack is fully charged or charging has been interrupted. Upon determining that battery pack charging is complete or has been aborted (i.e. affirmative determination at 210), the state-of-health determination circuitry (i.e., element 125 of FIGS. 1A and 1B) determines the battery pack SOH from the DCR, SOC and temperature values stored in 220 and 222. In one the state-of-health determination circuitry determines the SOH through a table lookup operation utilizing the DCR tables shown in FIG. 4 (described in further detail below). The state-of-health determination circuitry may alternatively or additionally determine (or refine) the SOH algorithmically (e.g., executing algorithms and/or applying mathematical equations or heuristic techniques).

At 230, battery pack performance statistics are determined or updated based on the battery pack SOH and transmitted to the electric vehicle battery management system via the control coupling 135 and the control network 152 where they are stored to be subsequently presented to the operator of the vehicle using the display 146. Information presented may include, without limitation, vehicle driving range, vehicle acceleration available, regenerative breaking performance and an estimate of when the battery pack will have to be replaced. After the vehicle battery management system 151 has been updated the electrical vehicle is decoupled from the charging station and the sequence completes.

As mentioned above, detail view 217 illustrates an exemplary sequence of operations that may be executed by the DCR determination circuitry 127 to perform a charging cycle 215. The charging cycle begins at 240 when the switch 161 is closed to enable a constant current to flow to the battery pack. The battery pack is charged with a constant current until a charging time interval $T_C$ transpires, a delay reflected in block 245. At the conclusion of charging interval $T_C$, and while the battery is being charged, the DCR determination circuitry acquires an initial battery voltage measurement, shown at 250 as $V_1$. After obtaining the initial battery voltage measurement, switch 161 is opened at 255 to decouple the charging source from the battery pack, interrupting flow of current into the battery pack and thus temporarily interrupting the battery pack charging operation (i.e., rendering the charging operation "discontinuous" as compared to conventional approaches that enable charging current to flow without interruption until the battery pack is fully charged). The charging discontinuity (i.e., cessation of charging current) continues until a relaxation time interval $T_R$ transpires, as shown in block 260. After relaxation interval $T_R$ elapses, a second, "post-interruption" voltage measurement, $V_2$, is acquired at 265 while the battery is not under charge, and a voltage delta (or voltage change), $\Delta V$, is determined by subtracting the initial voltage measurement from the post-interruption voltage measurement (i.e., $\Delta V = V_2 - V_1$). Thereafter, at 270, a DCR value for the battery pack is determined at 265 based on the voltage delta ($\Delta V$) and the charging current. For example, in one embodiment, the DCR determination circuitry determines a DCR value (i.e., internal resistance value) for the battery pack according the formula:

$$DCR = \Delta V / I_C$$

where $I_C$ is the constant current applied to the battery during a given charging cycle and $\Delta V$ is the voltage delta determined based on initial and post-interruption voltage measurements acquired in connection with the charging cycle. Other formulas, expressions, heuristics, etc. may be used to determine a DCR value for the battery pack (or refine the DCR determination) in alternative embodiments. For example, multiple initial (pre-interruption) voltage measures and/or multiple post-interruption voltage measurements may be acquired and statistically combined to generate finalized measures of the initial and post-interruption voltages (i.e., $V_1$ and $V_2$). Further, in one embodiment, the one or more post-interruption voltage measurements are applied to determine an asymptotic voltage (i.e., open circuit voltage to which the battery pack voltage would decline if the relaxation interval was substantially extended). This may be done, for example, by applying the one or more post-interruption voltages to determine coefficients and/or other terms in a battery modeling expression (e.g., relaxation equation), and applying the modeling expression to estimate the asymptotic voltage. Also, while $\Delta V$ and DCR values are depicted as being iteratively determined in respective charging cycles, and stored at the conclusion of each charging cycle, those calculations may be deferred (along with others) until the battery pack is fully charged and an array of measurement values (e.g., $V_1$, $V_2$ for each charging cycle 215, and possibly the accumulated current totals and temperature measurements corresponding to each charging cycle) has been obtained.

Figure 3:
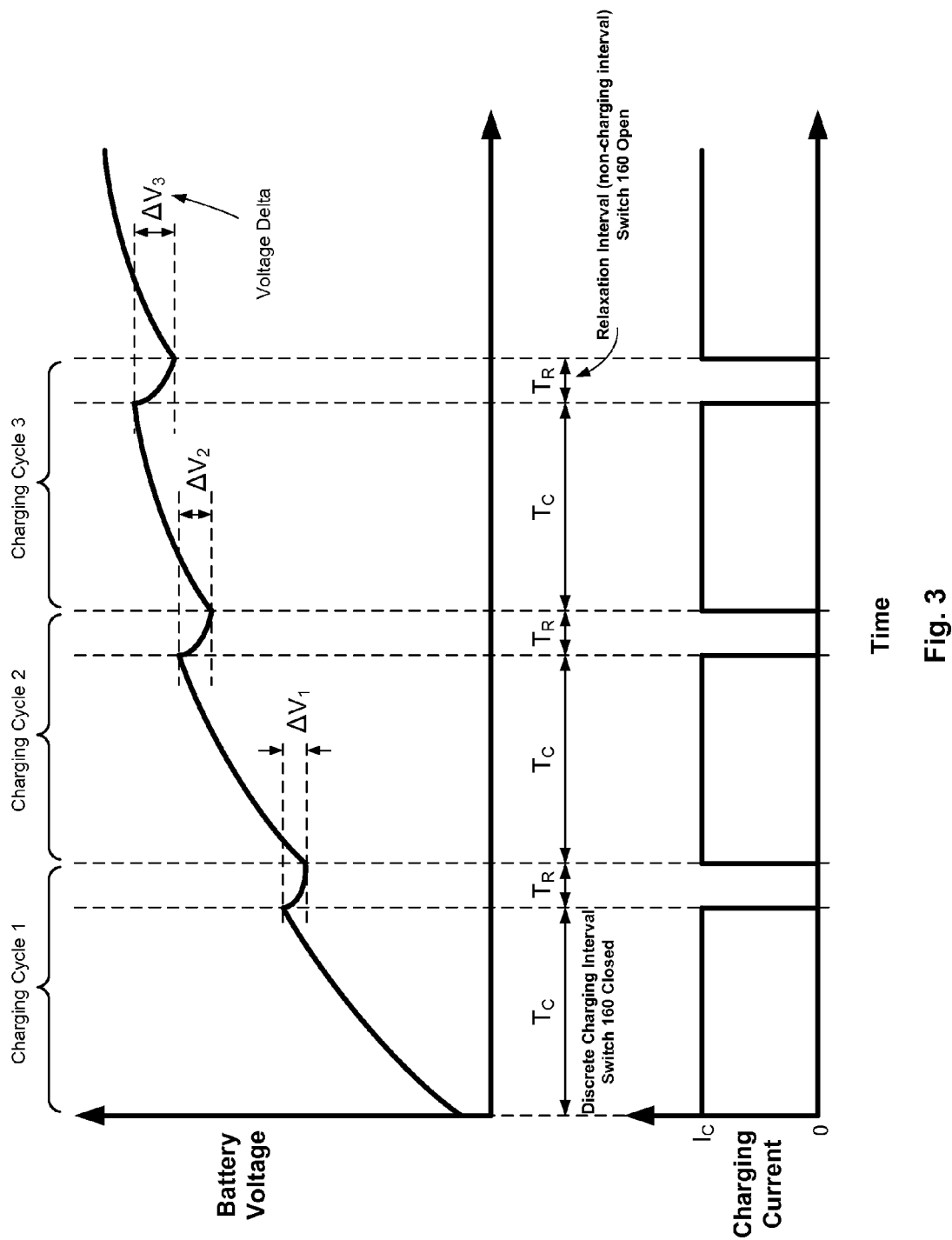
FIG. 3 shows an exemplary chart showing the change in battery pack voltages and charging currents that result from the DCR determination techniques resulting from the various embodiments described herein.

FIG. 3 is an exemplary illustration of the change in battery pack voltages and charging currents during the discontinuous charging operation of FIG. 2. As shown, the battery voltage progressively increases with each successive charging cycle 215, each of which includes a discrete charging interval followed by a relaxation (non-charging) interval. While only four charging cycles are depicted, there may be any practicable number of charging cycles in actual practice. Also, the relative durations of charging interval $T_C$ and relaxation interval $T_R$ are depicted for purposes of example only—in actual practice each discrete charging interval will generally be substantially longer than the relaxation interval, thus rendering the combined relaxation time (i.e., sum of all intervals $T_R$) a relatively small fraction of the overall discontinuous charging interval (sum of all intervals $T_C$ and all intervals $T_R$). In one embodiment, for example, $T_R$ is less than 5% of $T_C$ (or less than 1% of $T_C$), though higher or lower percentages may apply in alternative embodiments. Note that the discrete charging intervals need not be uniform and instead may vary in duration. Similarly, the relaxation intervals need not have uniform duration.

Referring to FIGS. 1B and 3, during each discrete charging interval, $T_C$, switch 160 is closed and a constant current $I_C$ is delivered to the battery pack, thereby charging the battery pack and raising the battery pack voltage. At the end of a given discrete charging interval (or discrete charging period), switch 160 is opened and current stops flowing. Consequently, the battery voltage begins decreasing or "relaxing" down to the open circuit voltage (OCV) corresponding the SOC of the battery at that time. At the end of the relaxation interval, $T_R$, the SOC of the battery may be determined and stored based on the post-interruption voltage measurement ($V_2$), and the voltage between the post-interruption voltage measurement and initial voltage measurement (i.e., reduction in voltage during the non-charging interval, which may be expressed as $\Delta V = V_2 - V_1$) may be determined and stored.

After one charging cycle completes the next charging cycle begins until the battery pack is fully charged or the charging process is aborted. As the charging process progresses, the state-of-charge (SOC) of the battery will increase, which may in turn change the $\Delta V$ measured at the end of each charging cycle. For example, the voltage delta for charging cycle 1 ($\Delta V_1$) may differ from the voltage deltas for charging cycles 2 and 3 (i.e., $\Delta V_2$ and $\Delta V_3$).

FIG. 4 shows multiple exemplary DCR tables 405, 415, 425 that may be generated and used to track changes in the DCR of a battery pack over time. Each table (three in this example, though there may be fewer or more DCR tables in other embodiments) stores the DCR values determined at specific battery pack SOC and temperature values at a particular point in time. In one embodiment, DCR values are loaded into one of the tables during the charging process just after the battery pack is manufactured (i.e. the battery pack is "new" and/or prior to sale of an electrically powered vehicle or other system containing the battery pack to an end-user) to provide the earliest possible reference information to determine the change in DCR over time. In this example, the table 405, 415 and 425 store DCR information determined on successive dates A, B and C respectively. In one embodiment, for example, the DCR determination circuitry may generate and store DCR information within a new DCR table every time the battery is charged. By contrast, in other embodiments, new tables may be created (and populated) only when changes in the DCR values exceed a threshold, thus reducing the amount of storage space in 126 required for the tables. Further embodiments may create a new table periodically (e.g. every week or every month) and/or overwrite tables (e.g., overwriting the oldest table when each new DCR table is generated so that a fixed number of tables remains available for metric generation). Note also that resistance values may be stored in any format that indicates the battery pack DCR. For example, any value or combination of values that indicate a ratio between a battery pack voltage reduction ($\Delta V$) and charging current may be stored within the lookup table, including finalized resistance values or raw voltage and/or current measurements. Further, during a given charging operation, it may not be possible to determine DCR values for all combinations of battery pack SOC and temperature values (in this example, each table has 4 SOC values and 4 temperature values for a total of 16 DCR values). In that case, the missing DCR values may be determined using interpolation or other mathematical techniques. In other embodiments cooling systems or mechanisms may be engaged to adjust the battery pack temperature to a target value or range, potentially improving the accuracy of the DCR determinations.

After sufficient data has been collected over several different charging operations, changes in DCR over time can be determined, for example, by comparing the DCR values obtained on different dates at the same SOC and temperature (i.e., the DCR values in the same table row/column of respective DCR tables corresponding to the same specific battery pack SOC and temperature). For example, DCR 2-4-A may be compared to DCR 2-4-B (arrow 410), and DCR 2-4-B may be compared to DCR 2-4-C (arrow 420). The change over time of these DCR values may be used to determine (or generate a value corresponding to) the state-of-health (SOH) of the battery and thus provide information regarding battery life and performance using a DCR/SOH lookup table or other mathematical or algorithmic technique.

In the foregoing description and in the accompanying drawings, specific terminology and drawing symbols have been set forth to provide a thorough understanding of the present invention. In some instances, the terminology and symbols may imply specific details that are not required to practice the invention. For example, while disclosed embodiments refer primarily to rechargeable battery packs, the embodiments may be practiced with respect to virtually any rechargeable energy storage system in which the discontinuous charging approaches discussed above may be used to assess internal resistance or other system characteristics (e.g., capacitor-based energy storage systems). Also, the various techniques and embodiments relating to battery packs may additionally be applied/practiced with respect to unit batteries (i.e., a single cell, including a constituent cell of a battery module or pack, and/or a super cell) and battery modules. As another example, the term "coupled" is used herein to express a direct connection as well as a connection through one or more intervening circuits or structures. Device or system "programming" may include, for example and without limitation, loading a control value into a register, one-time programmable-circuit (e.g., blowing fuses within a configuration circuit during device production) or other storage circuit within an integrated circuit device of the host system (or host device) and thereby control an operational aspect of the host system or establish a host system configuration. The terms "exemplary" and "embodiment" are used to express an example, not a preference or requirement. Signal paths that appear as single conductors may include multiple conductors and vice-versa, and components shown as being included within or forming part of other components may instead be disposed separately from such other components. With regard to flow diagrams and the like, the order of operations may be different from those shown and, where practical, depicted operations may be omitted and/or further operations added.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A method of characterizing a battery pack, the method comprising:
    charging the battery pack discontinuously in a plurality of discrete charging intervals;
    measuring a plurality of reductions in battery pack voltage that occur during respective non-charging intervals, each non-charging interval transpiring between a respective pair of the discrete charging intervals, wherein each of the plurality of reductions in battery pack voltage is a reduction from a first battery pack voltage to a second battery pack voltage, and wherein the first battery pack voltage and the second battery pack voltage increase from one non-charging interval to a next non-charging interval; and
    generating, based on the plurality of reductions in battery pack voltage, a respective plurality of resistance values that characterize an internal resistance of the battery pack, wherein the respective plurality of resistance values are monitored with respect to time; and
    generating a value indicating a state-of-health of the battery pack based on a difference between one or more of the respective plurality of resistance values and a corresponding set of one or more resistance values generated during a prior discontinuous charging of the battery pack; and
    detecting whether the battery pack needs to be replaced or repaired based upon the monitored respective plurality of resistance values as a function of time or the value indicating the state-of-health.

2. The method of claim 1 wherein measuring the plurality of reductions in battery pack voltage that occur during respective non-charging intervals comprises determining the first battery pack voltage before each of the non-charging intervals and determining the second battery pack voltage at a conclusion of each of the non-charging intervals, each of the reductions in battery pack voltage corresponding to a difference between the first and second battery pack voltages determined before and at the conclusion of a respective one of the non-charging intervals.

3. The method of claim 2 wherein each of the non-charging intervals is immediately preceded by a respective one of the discrete charging intervals, and wherein determining the first battery pack voltage before each of the non-charging intervals comprises measuring a voltage across output terminals of the battery pack at least once at a conclusion of the immediately preceding discrete charging interval.

4. The method of claim 2 wherein each of the non-charging intervals is immediately preceded by a respective one of the discrete charging intervals, and wherein determining the second battery pack voltage at the conclusion of each of the non-charging intervals comprises measuring a voltage across output terminals of the battery pack at least once at the conclusion of the non-charging interval.

5. The method of claim 4 wherein determining the second battery pack voltage at the conclusion of each of the non-charging intervals further comprises determining, as the second battery pack voltage, an asymptotic voltage indicated by the at least one measurement of the voltage across output terminals of the battery pack at the conclusion of the non-charging interval.

6. The method of claim 1 wherein the value corresponding to the current provided to charge the battery pack comprises a value corresponding to a current provided to charge the battery pack during one of the discrete charging intervals immediately preceding the respective one of the reductions in battery pack voltage.

7. The method of claim 1 wherein charging the battery pack discontinuously in a plurality of discrete charging intervals comprises charging the battery pack with a constant current during each of the discrete charging intervals.

8. The method of claim 1 wherein discontinuously charging the battery pack in the sequence of discrete charging intervals comprises switchably coupling a charging source to the battery pack during each of the discrete charging intervals and switchably decoupling the charging source from the battery pack during each of the non-charging intervals.

9. The method of claim 1 wherein each non-charging interval is substantially briefer than the duration of an immediately preceding one of the discrete charging intervals.

10. The method of claim 1 further comprising generating a value indicating a state-of-health of the battery pack based on a difference between one or more of the resistance values and a corresponding set of one or more resistance values generated during a prior discontinuous charging of the battery pack.

11. The method of claim 10 wherein the prior discontinuous charging of the battery pack occurred prior to sale of a system containing the battery pack to an end-user of the system.

12. The method of claim 10 further comprising adjusting the resistance values to compensate for differences in at least one of temperature and state-of-charge of the battery pack with respect to the corresponding set of one or more resistance values generated during the prior discontinuous charging of the battery pack.

13. The method of claim 1 further comprising storing each one of the resistance values in a respective location within a lookup table.

14. The method of claim 1 wherein storing each one of the resistance values comprises storing, for each one of the resistance values, one or more values that indicate a ratio between the respective reduction in battery pack voltage and a current provided to charge the battery pack.

15. The method of claim 13 further comprising determining the respective location within the lookup table based on a state-of-charge of the battery pack during one of the non-charging intervals corresponding to the one of the resistance values.

16. The method of claim 15 further comprising determining the respective location based on a temperature of the battery pack during the one of the non-charging intervals corresponding to the one of the resistance values.

17. The method of claim 1 wherein generating the plurality of resistance values that characterize the internal resistance of the battery pack comprises generating a plurality of resistance values that correspond to a temperature and state of charge of the battery pack at the respective non-charging intervals.

18. An apparatus for characterizing a battery pack, the apparatus comprising:
charging control circuitry to cyclically couple and decouple the battery pack from a charging source to effect a discontinuous charging operation in which a plurality of discrete charging intervals are separated from one another by respective non-charging intervals;
measurement circuitry to measure a plurality of reductions in battery pack voltage that occur during the respective non-charging intervals, each of the plurality of reductions in battery pack voltage having a reduction from a first battery pack voltage to a second battery pack voltage, with the first battery pack voltage and the second battery pack voltage increasing with each of at least a subset of the discrete charging intervals;
resistance determination circuitry to generate, based on the plurality of reductions in battery pack voltage, a respective plurality of resistance values that characterize an internal resistance of the battery pack and to monitor the respective plurality of resistance values as a function of time;
circuitry to generate a value indicating a state-of-health of the battery pack based on a difference between one or more of the resistance values and a corresponding set of one or more resistance values generated during a prior discontinuous charging of the battery pack; and
maintenance determination circuitry to detect whether the battery pack needs to be replaced or repaired based upon the monitored respective plurality of resistance values as a function of time.

19. The apparatus of claim 18 wherein the resistance determination circuitry comprises circuitry to generate each of the resistance values by dividing a respective one of the reductions in battery pack voltage by a value corresponding to a current provided to charge the battery pack.

20. The apparatus of claim 18 further comprising a memory and circuitry to store each one of the resistance values within the memory in a respective lookup table location.

21. The apparatus of claim 20 wherein the circuitry to store each one of the resistance values within the memory in the respective lookup table location comprises circuitry to determine the respective location based on (i) a state-of-charge of the battery pack during one of the non-charging intervals corresponding to the one of the resistance values and (ii) a temperature of the battery pack during the one of the non-charging intervals corresponding to the one of the resistance values.

22. An apparatus comprising:
means for cyclically coupling and decoupling the battery pack from a charging source to effect a discontinuous charging operation in which a plurality of discrete charging intervals are separated from one another by respective non-charging intervals;
means for measuring a plurality of reductions in battery pack voltage that occur during the respective non-charging intervals, wherein each such reduction in battery voltage has a reduction from a first battery pack voltage to a second battery pack voltage, and wherein the first battery pack voltage and the second battery pack voltage increase with each of a plurality of charging cycles;
means for generating, based on the plurality of reductions in battery pack voltage, a respective plurality of resistance values that characterize an internal resistance of the battery pack;
means for generating a value indicating a state-of-health of the battery pack based on a difference between one or more of the resistance values and a corresponding set of one or more resistance values generated during a prior discontinuous charging of the battery pack;
means for monitoring the respective plurality of resistance values as a function of time; and means for detecting whether the battery pack needs to be replaced or repaired based upon the monitored respective plurality of resistance values as a function of time.

\* \* \* \* \*